(12) United States Patent
Sucharczuk et al.

(10) Patent No.: US 6,523,916 B2
(45) Date of Patent: Feb. 25, 2003

(54) CHASSIS WITH REPOSITIONABLE PLATES

(75) Inventors: Guy Sucharczuk, Sunnyvale, CA (US); Krzysztof Pradzynski, Santa Clara, CA (US); Artie Avlonitis, San Jose, CA (US); Jose Salinas, East Palo Alto, CA (US)

(73) Assignee: Aurora Networks, Inc., Santa Clara, CA (US)

( * ) Notice: Subject to any disclaimer, the term of this patent is extended or adjusted under 35 U.S.C. 154(b) by 0 days.

(21) Appl. No.: 09/748,747

(22) Filed: Dec. 22, 2000

(65) Prior Publication Data

US 2002/0079791 A1 Jun. 27, 2002

(51) Int. Cl.[7] .............................................. A47B 97/00
(52) U.S. Cl. .................................................. 312/223.2
(58) Field of Search ........................ 312/223.1, 223.2, 312/257.1, 265.5, 265.6, 293.1, 293.3, 213, 334.13, 323; 361/724, 725, 728, 729, 730

(56) References Cited

U.S. PATENT DOCUMENTS

| | | | |
|---|---|---|---|
| 2,780,510 A | * 2/1957 | Cole, Jr. ................ | 312/334.13 |
| 4,553,674 A | 11/1985 | Yoshikawa et al. | |
| 4,602,829 A | * 7/1986 | De Andrea .............. | 312/223.1 |
| 4,751,613 A | 6/1988 | Werdin | |
| 5,119,270 A | * 6/1992 | Bolton et al. ................ | 361/687 |
| 5,381,314 A | 1/1995 | Rudy, Jr. et al. | |
| 5,826,882 A | * 10/1998 | Ward .................... | 312/265.6 X |
| 5,880,931 A | * 3/1999 | Tilton et al. .......... | 312/223.2 X |
| 5,893,618 A | * 4/1999 | LePage, Jr. et al. ..... | 312/265.6 |
| 6,038,126 A | 3/2000 | Weng | |
| 6,088,224 A | * 7/2000 | Gallagher et al. ... | 312/223.2 X |
| 6,183,053 B1 | * 2/2001 | Foslien et al. ........... | 312/265.6 |

FOREIGN PATENT DOCUMENTS

| | | | |
|---|---|---|---|
| DE | 1129193 | 5/1962 | |
| FR | 1354308 | * 1/1964 | .............. 312/223.1 |
| WO | WO97/34452 A1 | 9/1997 | |

OTHER PUBLICATIONS

European Search Report for PCT/US01/49278, Sep. 17, 2002.

* cited by examiner

Primary Examiner—James O. Hansen
(74) Attorney, Agent, or Firm—Gray Cary Ware & Freidenrich, LLP

(57) ABSTRACT

Methods, systems and devices are described for a chassis with repositionable plates. An apparatus, including a chassis having a first module bay with a first plate mounting bracket, a second module bay with a second plate mounting bracket and a repositionable plate that is removably connectable to the first plate mounting bracket and removably connectable to said second plate mounting bracket.

7 Claims, 10 Drawing Sheets

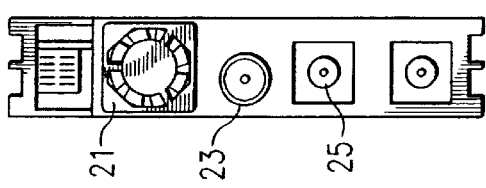
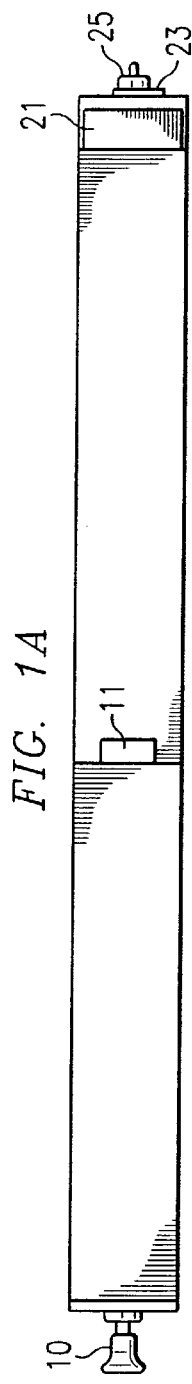
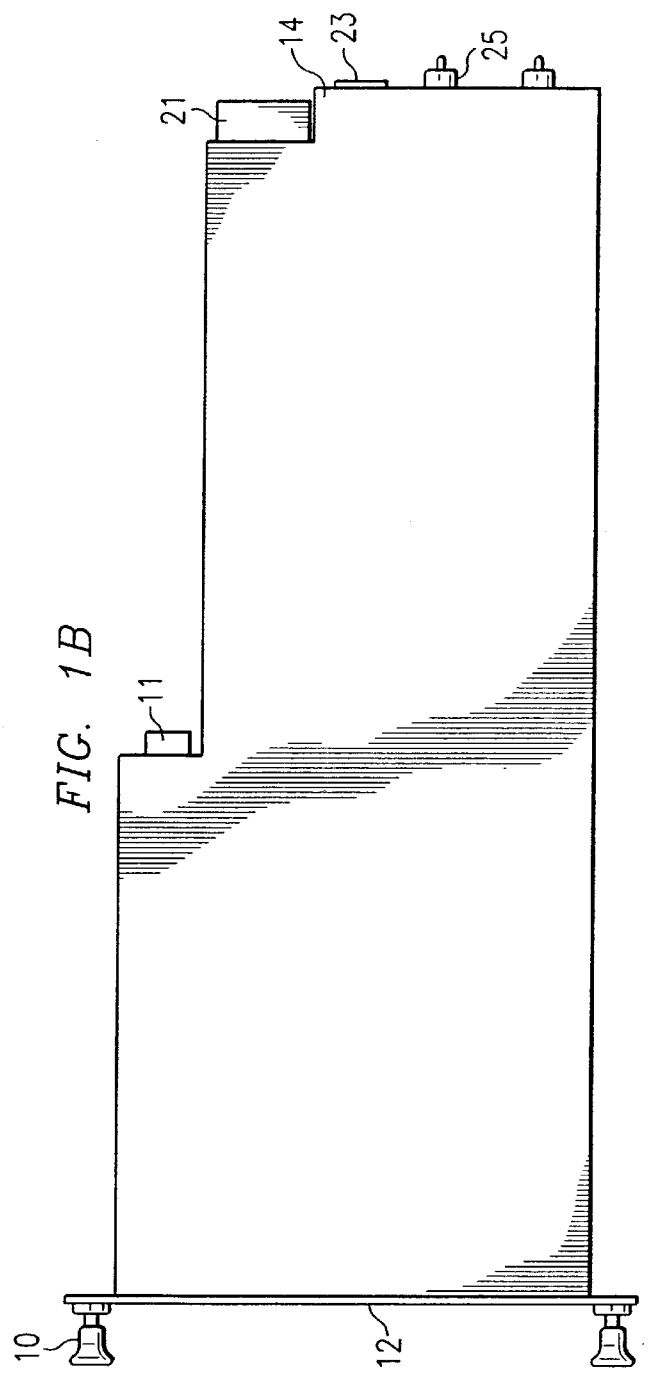

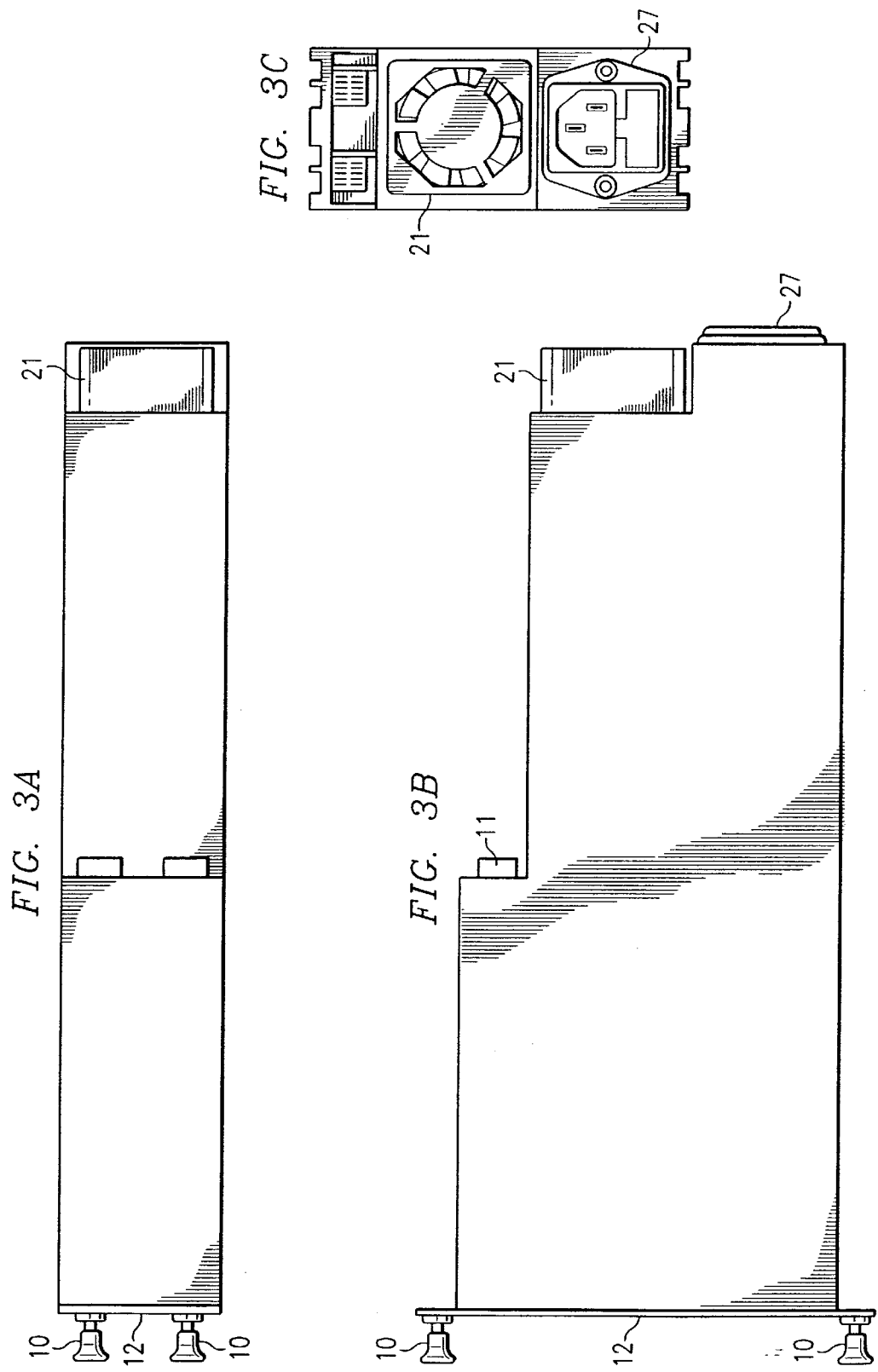

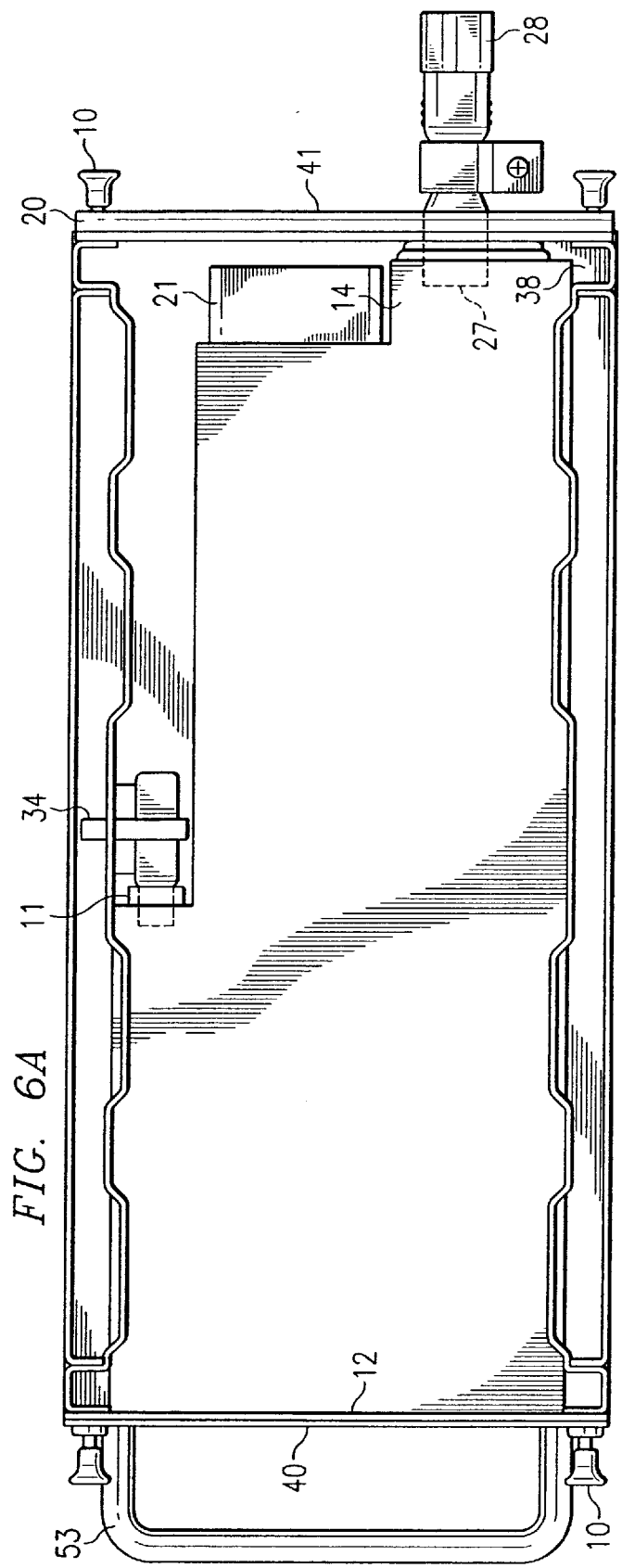

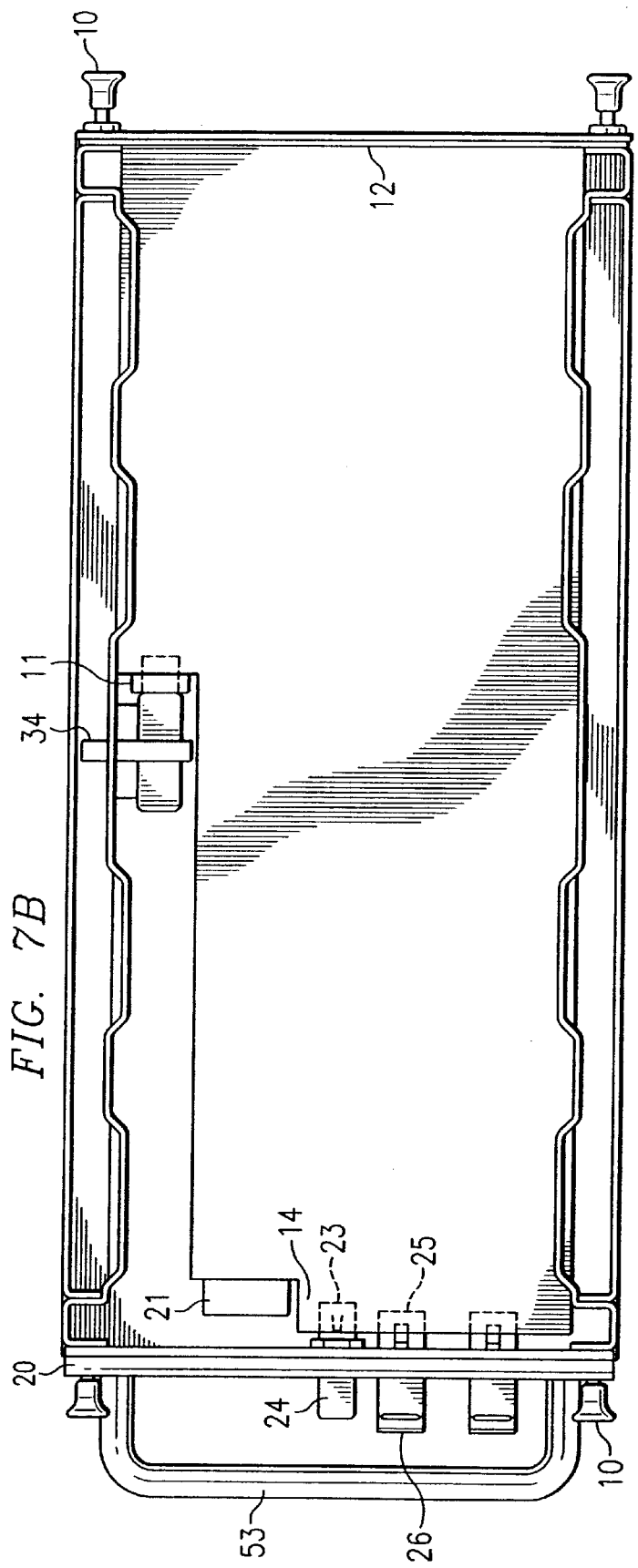

CHASSIS WITH REPOSITIONABLE PLATES

BACKGROUND OF THE INVENTION

I. Field of the Invention

The invention relates generally to the field of electrical equipment. More particularly, the invention relates to chassis mounted modular electrical equipment.

II. Description of Related Art

An electrical chassis should allow for custom configurations and a relatively high density of components. A modular design of both the chassis and the equipment modules provides a customer with the ability to easily select and install the equipment modules necessary for a specific application.

Designs of electrical equipment generally include a chassis with a plurality of individual components and assemblies mounted therein and connected to the chassis and/or to one another by one or more bus, wires, cables, brackets, nuts, bolts and the like. The modularity of electrical systems is an important design consideration. Modules can be removed and examined for operability, replaced, or repositioned much easier than permanently mounted fixtures within a rack or chassis. It is important to maintain the reliability and integrity of the system. When the various elements of an electrical system can be easily removed in a modular form, they can also be easily replaced to maintain the operational status of the electrical system. A chassis preferably ensures easy access, simple installation and fast maintenance.

Most chassis designs are restricted in the location and orientation of modular components placed in the chassis. For example, the bays for the modular components typically allow only for entry from the rear of the chassis. What is required is an approach that allows flexibility in the location and orientation of modular components within the chassis. The invention is directed to meeting these requirements, among others.

SUMMARY OF THE INVENTION

Thus, there is need for the following embodiments. One embodiment of the invention is based on an apparatus, comprising a chassis including a first module bay and a second module bay, said first module bay and said second module bay together composing both a forward section and rearward section.

Another embodiment of the invention is based on a method, comprising providing a chassis with a first module bay and a second module bay, said first module bay and said second module bay together composing a forward section and rearward section.

Another embodiment of the invention is based on a kit, comprising a chassis including a first module bay and a second module bay, said first module bay and said second module bay together composing both a forward section and a rearward section.

Another embodiment of the invention is based on an apparatus comprising a chassis including a first module bay having a first plate mounting bracket and a second module bay having a second plate mounting bracket; and a repositionable plate that is removably connectable to said first plate mounting bracket and removably connectable to said second plate mounting bracket. Further embodiments of the current invention comprise a communications network, comprising the apparatus described hereinabove and a method for deploying a communications network.

Another embodiment of the invention is based on a method comprising: providing a chassis with a first module bay having a first plate mounting bracket and a second module bay having a second plate mounting bracket; and connecting a repositionable plate to said first plate mounting bracket, said repositionable plate removable from said first plate mounting bracket and removably connectable to said second plate mounting bracket.

Another embodiment of the invention comprises a kit, comprising: a chassis including a first module bay having a first plate mounting bracket and a second module bay having a second plate mounting bracket; and a repositionable plate that is removably connectable to said first plate mounting bracket and removably connectable to said second plate mounting bracket.

These, and other embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted that the features illustrated in the drawings are not necessarily drawn to scale.

FIGS. 1A–1C illustrate orthographic views of a module representing an embodiment of the invention.

FIGS. 3A–3C illustrate orthographic views of another module, representing an embodiment of the invention.

FIGS. 6A and 6B illustrate orthographic views of the module, repositionable plate and chassis depicted in FIGS. 3A–3C, 4A–4C and 5A–5C, respectively.

FIGS. 7A and 7B illustrate orthographic views of the module repositionable plate and chassis depicted in FIGS. 1A–1C, 2A–2C and 5A–5C, respectively.

DESCRIPTION OF ILLUSTRATIVE EMBODIMENTS

I. The Invention

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

Figure 8:
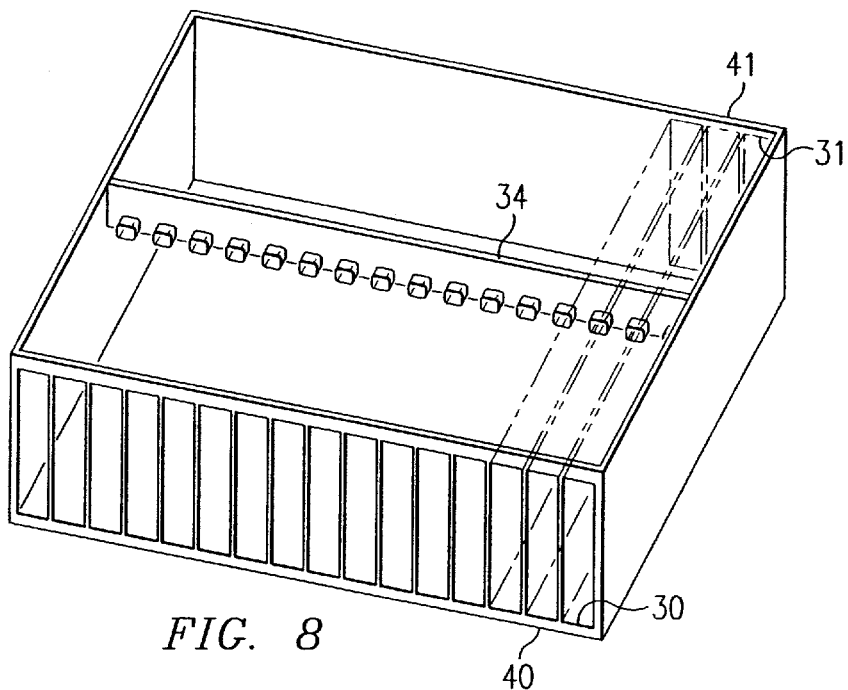
FIG. 8 illustrates a schematic view of a chassis comprising two modular bays and an intersection board, representing an embodiment of the invention.

Referring to FIG. 8, a chassis is depicted comprising two module bay sections, including two module bay forward sections 30 and two module bay rearward sections 31. There can be 2, 3, 4, 5, 6, 7, 8, 9, 10, 11, 12, 13, 14, 15, 16, 17, 18, 19, 20, 25, 30, 40, or more forward and rearward module bay sections in the chassis. The forward and rearward sections comprise the area between the front of the chassis and the intersection board 34 and the area between the intersection board 34 and the rear of the chassis. The chassis comprises an intersection board 34 between the forward and rearward module bay sections. If the intersection board 34 is placed substantially symmetrically between the forward 30 and rearward 31 module bay sections, it is also referred to as a midplane board. The intersection board 34 may be located in any plane in the interior of the chassis between the front 40 and the rear 41 of the chassis. The intersection board 34 may be located about 10%, about 20%, about 25%, about 30%, about 40%, about 50%, about 60%, about 70%, about 75%, about 80%, or about 90% of the way from the front of the chassis 40 to the rear of the chassis 41. The intersection board 34 is shown extending the entire width of the chassis. The intersection board 34 in FIG. 8 will extend at least a portion of the interior width of the chassis; it may extend the width of less than about 10%, about 20%, about 30%, about 40%, about 50%, about 60%, about 70%, about 80%, about 90%, or about 100% of the interior chassis width. The height of the intersection board 34 shown in FIG. 8 is less than the interior height of the chassis. The height may be about 0.1, about 0.2, about 0.3, about 0.4, about 0.5, about 0.6, about 0.7, about 0.8, or about 0.9 times the interior height of the chassis.

There is no difference between the forward and rearward sections of the chassis as demonstrated in FIG. 8. The terms "front" or "forward" and "rear", "back", or "rearward" when referring to the chassis are not related to the orientation of the chassis in a room or to the orientation relative to the force of gravity. These terms are used solely for the convenience of demarcation and communicating relative positions within the chassis. If a chassis of the current invention is rotated 180° and the "front" and "rear" are relabeled, there would be no functional difference between the chassis before rotation and the chassis after rotation.

Still referring to FIG. 8, the intersection board 34 can be a virtual intersection board. A virtual plane is created when a plurality of modules are coupled to each other. Modules at least in-part within the forward and the rearward sections of a modular bay or at least in-part within adjacent modular bays may be connected to each other instead of an intersection board. These electronic connectors create a virtual plane within the chassis which extends in a direction substantially parallel to the front and rear faces of the chassis. It is contemplated that the virtual intersection board 34 span a portion of the interior width of the chassis. For example, a module located at least in-part within a forward section of a module bay can be electronically coupled at a point located substantially symmetrically between the front of the chassis and the back of the chassis to a module located at least in-part within the rearward bay section of the chassis. Modules in adjoining module bay sections may or may not also be electronically coupled to each other or to the modules previously described. To couple modules in adjoining bay sections, it would be required to have a connector on the modules facing substantially orthogonal to the direction of insertion for the module such that the connector would contact a similar connector when a module was inserted into an adjacent modular bay. The height, width, and location within the chassis of the virtual intersection board 34 may be varied similarly to that of an intersection board. The virtual intersection board 34 may be located about 10%, about 20%, about 25%, about 30%, about 40%, about 50%, about 60%, about 70%, about 75%, about 80%, or about 90% of the way from the front of the chassis to the rear of the chassis. The virtual intersection board 34 will extend at least a portion of the interior width of the chassis; it may extend the width of less than about 10%, about 20%, about 30%, about 40%, about 50%, about 60%, about 70%, about 80%, about 90%, or about 100% of the interior chassis width. The height of the virtual intersection board 34 is less than the interior height of the chassis. The height may be about 0.1, about 0.2, about 0.3, about 0.4, about 0.5, about 0.6, about 0.7, about 0.8, or about 0.9 times the interior height of the chassis.

An additional board, an intermediate board, may be coupled to the chassis. The intermediate board is located either between the intersection board 34 and the front of the chassis or between the intersection board 34 and the rear of the chassis. For example, an intersection board may be located substantially symmetrically between a front of the chassis and a back of the chassis. An intermediate board may be located substantially symmetrically between an intermediate board and a back of the chassis. The intermediate board may also be a virtual intermediate board. For example, the intermediate board may be solid state while the intersection board is be virtual or both the intermediate board and the intersection board are virtual. More than one intermediate board may be located within a chassis.

Figure 9B:
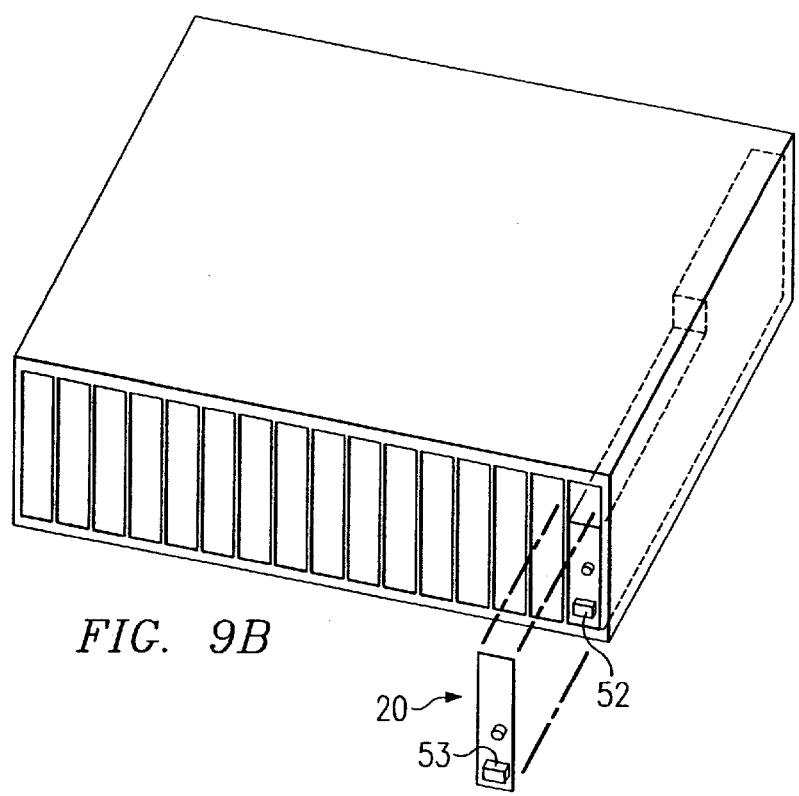
FIGS. 9A and 9B illustrate schematic views of a chassis comprising two modular bays and a module, representing an embodiment of the invention.
Figure 9A:
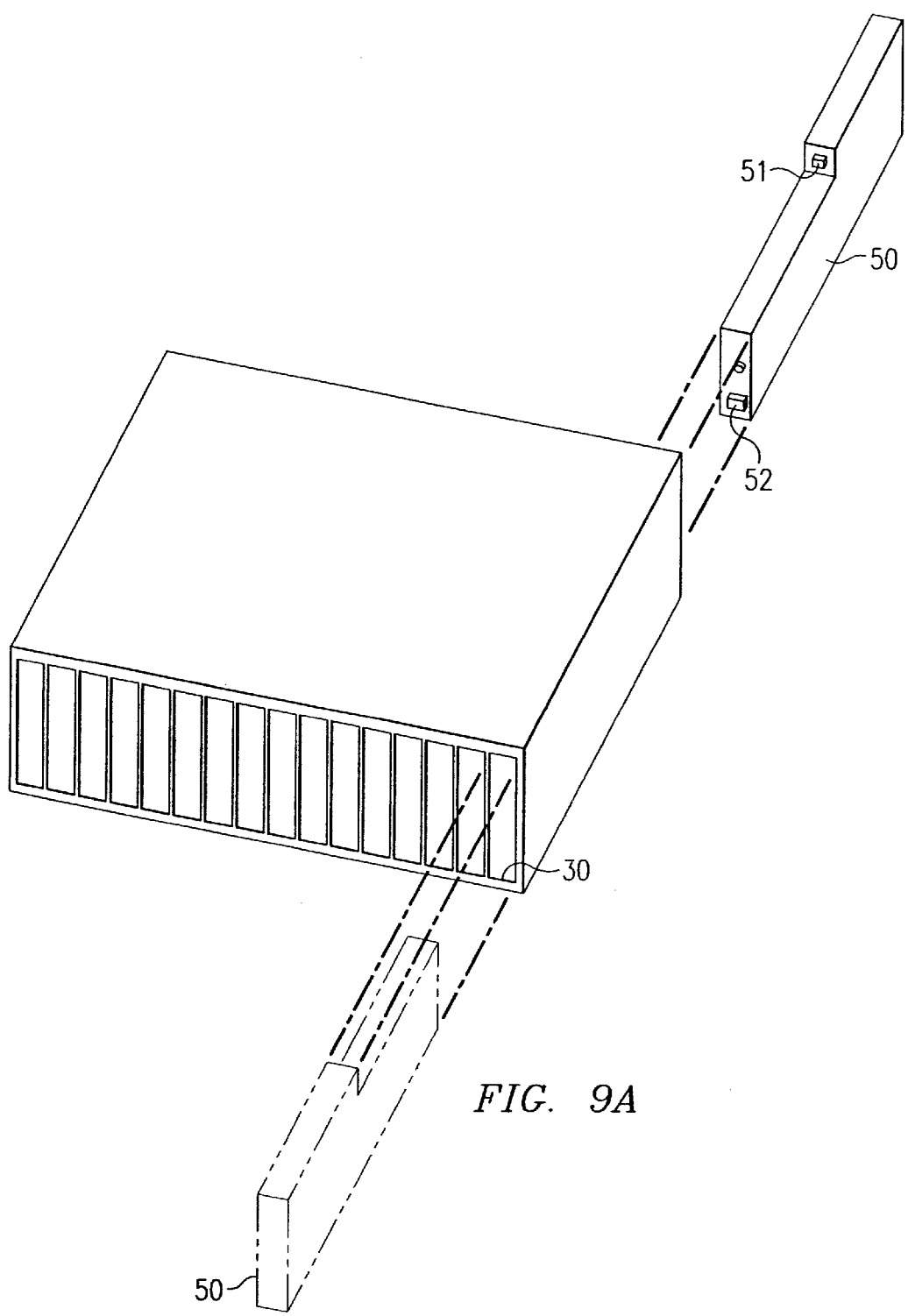

Referring to FIG. 9A, a chassis is shown with a module 50 positioned to be inserted into both a forward 30 and a rearward 31 modular bay section. The module 50 positioned to be inserted into the rearward modular bay section 31 is shown as a solid component and the module 50 positioned to be inserted into the forward modular bay section is shown by dotted lines. The module 50 comprises two different heights such that the height of the end of the module inserted into the module bay first is less than the height of the end of the module that will contact the chassis last. Connectors 51, represented by the diamond and square in the upper part of the module, can connect to the intersection board or an intermediate board within the chassis. The connectors 51 can also connect to another module to create a virtual intersection board. It is contemplated that the connectors on the module could be positioned at various positions between the two ends of the module. For example, the connector could be halfway between ends of the module as shown in FIG. 9A. The connectors could be located about 10%, about 20%, about 30%, about 40%, about 50%, about 60%, about 70%, about 80%, or about 90% of the way from end of the module that is inserted into the module bay.

Although FIG. 9A is drawn such that any intersection board must be located in the upper half of the chassis to connect to the module 50, it is understood that the designations of top and bottom can easily be reversed. A chassis of the current invention with an intersection board located at the bottom of the chassis would require the module 50 shown in FIG. 9A to be vertically flipped 180° before insertion into the chassis.

Referring to FIG. 9B, the chassis and module 50 of FIG. 9A is shown after insertion of the module 50. The orientation of the inserted module 50 is depicted in FIG. 9A as having solid lines. A repositionable plate 20 is shown in an orientation for connection through one or more connectors 52 with the chassis and module 50. The repositionable plate 20 is configured such that it can be connected to the chassis via plate mounting brackets located on the module bays of the chassis. If a module 50 is inserted into the front of the chassis, the repositionable plate would then be connected to the chassis and module 50 from the back of the chassis. The repositionable plate comprises a plurality of elements 53 which can include manually actuatable fasteners such as thumb screws, ventilation slots and electrical feedthroughs which are capable of conducting power or communicating data.

Figure 4A:
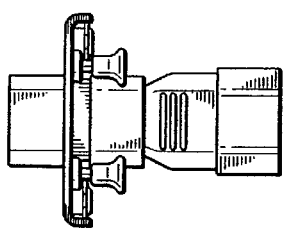
FIGS. 4A–4C illustrate orthographic views of a repositionable plate that can be used with the module of FIGS. 3A–3C representing an embodiment of the invention.
Figure 4B:
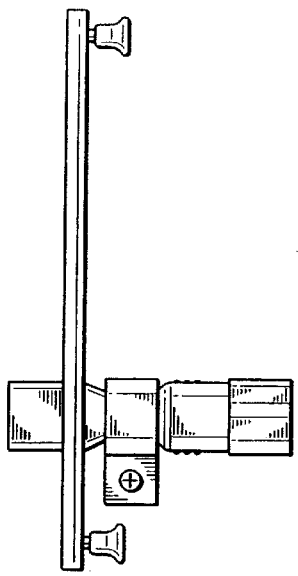
Figure 4C:
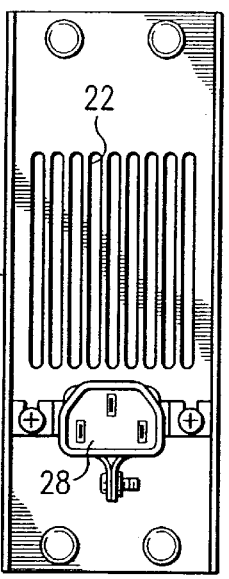

A repositionable plate is modular in nature. Repositionable plates can interchangeably be connected to the module bays of the chassis. A repositional plate may be sized to connect to 1, 2, 3, 4, 5 or more module bays. It can be seen from FIGS. 2A–2C and 4A–4C that the repositionable plate of FIGS. 4A–4C is twice the width of the repositionable plate of FIGS. 2A–2C. Similarly, the module of FIGS. 3A–3C is twice the width of the module of FIGS. 1A–1C. It is an aspect of the current invention that one module and/or one repositionable plate is connected to a plurality of modular bays.

It is not necessary that a repositionable plate connected to a chassis be connected to a module located in the modular bay directly behind the repositionable plate. The repositionable plate may be connected to a module located in any of the module bays in the chassis by means of wires, cables, or other connectors in the interior of the chassis. This allows for the placement of connections external to the chassis into more preferred positions without creating a "rats nest" of wires.

The particular material used for the repositionable plates should be strong and durable. Conveniently, the repositionable plates of the invention can be made of any metal material. If a conductive material is used, it is preferred that the material be coated with an insulating layer such as, for example, paint. For the manufacturing operation, it is an advantage to employ a cold rolled sheet steel material.

However, the particular material selected for the repositionable plates is not essential to the invention, as long as it provides the described function. Normally, those who make or use the invention will select the best commercially available material based upon the economics of cost and availability, the expected application requirements of the final product, and the demands of the overall manufacturing process.

The particular manufacturing process used for fabricating the repositionable plates should be inexpensive and reproducible. Conveniently, the manufacture of the repositionable plates of the invention can be carried out by using any sheet metal fabrication method. If sheet metal is used, it is preferred that the processing start with perforating, followed by forming, and then optional painting and attachment of hardware (e.g., feed-throughs, thumbscrews, etceteras).

However, the particular manufacturing process used for making the repositionable plates is not essential to the invention as long as it provides the described functionality. Normally those who make or use the invention will select the manufacturing process based upon tooling and energy requirements, the expected application requirements of the final product, and the demands of the overall manufacturing process.

The invention can also be included in a kit. The kit can include some, or all, of the components that compose the invention. More specifically, the kit can include a chassis, the module bay sections and other components of the invention. The kit can also include an intersection board or an intermediate board. The kit can also contain instructions for practicing the invention and apparatus for carrying out the invention. Unless otherwise specified, the components (and apparatus and/or instructions) of the kit can be the same as those used in the invention.

The term substantially, as used herein, is defined as at least approaching a given state (e.g., preferably within 10% of, more preferably within 1% of, and most preferably within 0.1% of). The term coupled, as used herein, is defined as connected, although not necessarily directly, and not necessarily mechanically. The term deploying, as used herein, is defined as designing, building, shipping, installing and/or operating. As used in the specification, "a" or "an" mean one or more. As used in the claim(s), when used in conjunction with the word "comprising", the words "a" or "an" mean one or more than one. As used herein "another" may mean at least a second or more.

II. EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

Example 1

Referring to FIGS. 1A–1C, the module comprises at least one manually actuatable fastener 10 located at the closed end of the module 12 or the communicating end of the module 14. A power connector 11 is connected at the midpoint of the module. A fan 21, an RF connector 23, and at least one optical connector 25 are located at the communicating end of the module 14. A variety of other elements may also be located at the communicating end of the module 14. The power connector 11 can be located at various positions between the closed end 12 and the communicating end 14 of the module.

Figure 2A:
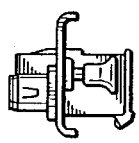
FIGS. 2A–2C illustrate orthographic views of a repositionable plate that can be used with the module of FIGS. 1A–1C, representing an embodiment of the invention.
Figure 2B:
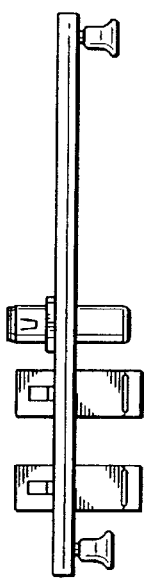
Figure 2C:
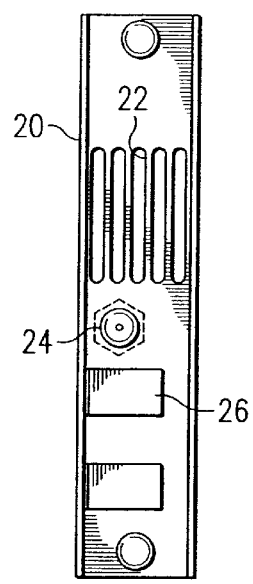

The repositionable plate 20 which is configured for connection to the module of FIGS. 1A–1C is depicted in FIGS. 2A–2C. The repositionable plate comprises manually actuatable fasteners 10, a plurality of ventilation slots 22 which can be operationally connected to the fan 21, an RF feed-through 24 which can be operationally connected to a RF connector 23, and at least one optical feed-through 26 each of which can be independently operationally connected to optical connectors 25. The repositionable plate 20 of FIGS. 2A–2C can be connected to the communicating end of the module 14 of FIGS. 1A–1C and to the plate mounting bracket on a chassis. The repositionable plate 20 is removable without tools, and can include a plurality of manually actuatable fasteners, an electrical feedthrough, and a plurality of ventilation slots.

Example 2

Referring to FIGS. 3A–3C, the power supply module comprises at least one manually actuatable fastener 10 located at the closed end of the module 12 or the communicating end of the module 14. A plurality of power connector 11 are connected at the midpoint of the module. A fan 21 and an AC inlet 27 are located at the communicating end of the module 14. A variety of other elements may also be located at the communicating end of the module 14. As in FIGS. 1A–1C, the power connector 11 can be located at various positions between the closed end 12 and the communicating end 14 of the module.

The repositionable plate 20 which is configured for connection to the module of FIGS. 3A–3C is depicted in FIGS. 4A–4C. The repositionable plate comprises manually actuatable fasteners 10, a plurality of ventilation slots 22 which can be operationally connected to a fan 21 and an electric feed-through 28 which can be operationally connected to an AC inlet 27. The repositionable plate 20 of FIGS. 4A–4C may be connected to the communicating end of the module 14 of FIGS. 2A–2C and to the plate mounting bracket on a chassis.

Example 3

Figure 5A:
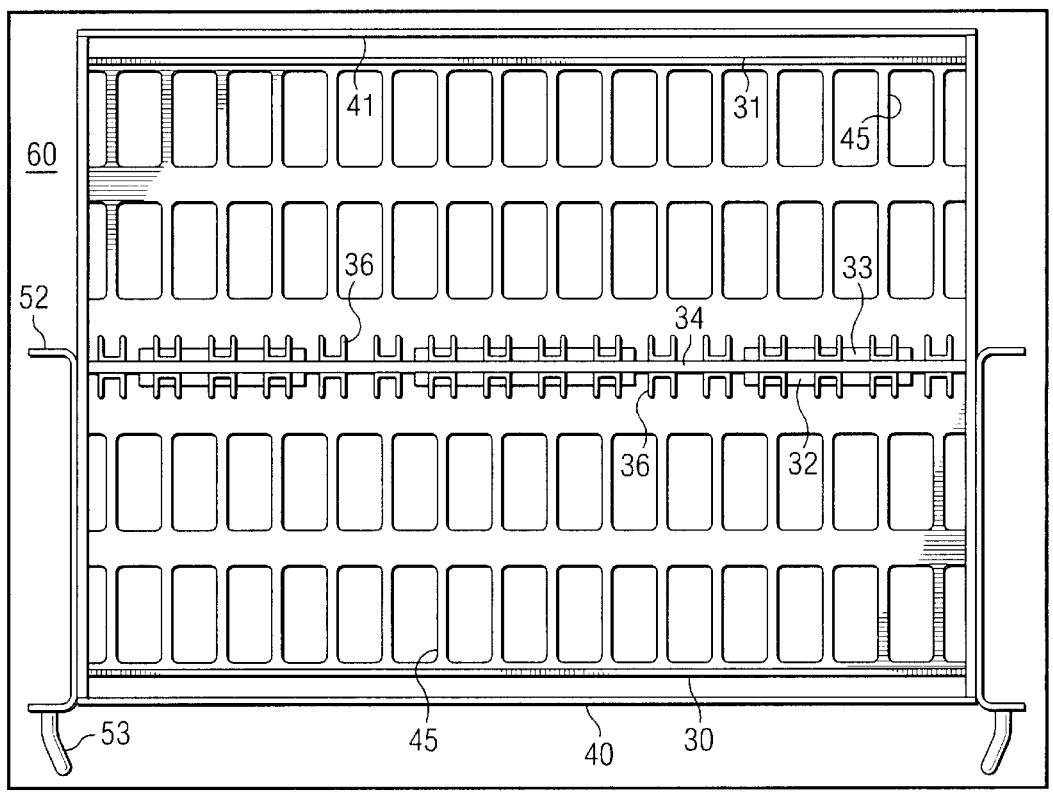
FIGS. 5A–5C illustrate orthographic views of a chassis, representing an embodiment of the invention.
Figure 5B:
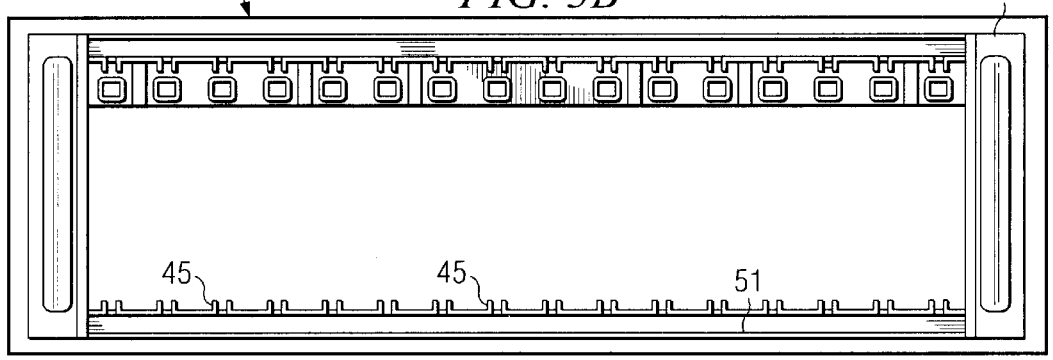
Figure 5C:
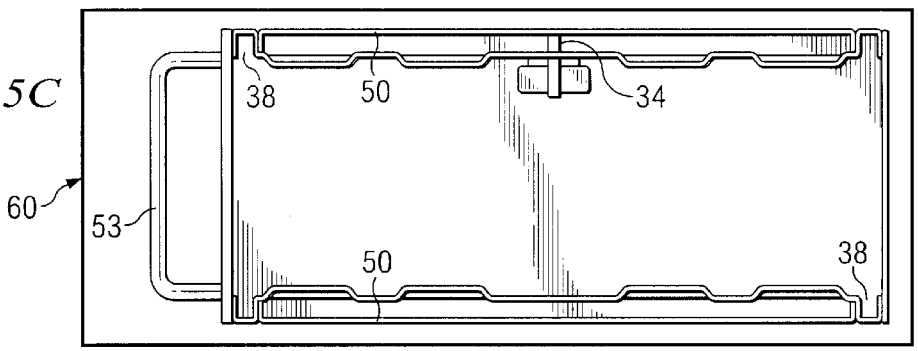

Referring to FIGS. 5A–5C, a chassis is depicted comprising a plurality of module bay sections, including a plurality of module bay forward sections 30 and a plurality of module bay rearward sections 31. Repositionable plate mounting brackets 38 are connected to the chassis at the outside edge of each module bay forward sections 30 and module bay rearward sections 31. A plurality of connectors 36 are located between the forward and rearward module bay sections and are used for connection modules to the module bay sections 30–31. 16 modular bay sections are shown in FIGS. 5A–5C, any of which could be described as a first or second modular bay section. The location of the first and second modular bay sections within the chassis is not important to the invention. Card guides 45 are positioned near the bottom cover 51 of the chassis and are used for guiding modules into the module bay sections 30–31. On the exterior of the chassis optional cabinet mounts 52, handles 53 and a rack mount 54 are included. The chassis can be coupled to a rack 60 via the rack mount 54. and are used for connecting modules to the module bay sections 30–31. 16 modular bay sections are shown in FIGS. 5A–5C, any of which could be described as a first or a second modular bay section. The location of the first and second modular bay section within the chassis is not important to the invention. Card guides 45 are positioned near the bottom cover 51 of the chassis and are used for guiding modules into the module bay sections 30–31. On the exterior of the chassis optional cabinet mounts 52, handles 53 and a rack mount 54 are included.

Still referring to FIGS. 5A–5C, an intersection board 34 is mechanically coupled to the chassis with front holders 32 and rear holders 33. The intersection board 34 is orthogonal to the front and rear faces of the chassis. As depicted midway between the front and the rear of the chassis, the intersection board 34 can also be described as a midplane board. The intersection board 34 can also be located at different distances between the front and rear of the chassis. The only difference between the "forward" and "rearward" sections of the chassis is that there are exterior handles and cabinet mount on the exterior of the forward section.

Example 4

Figure 6B:
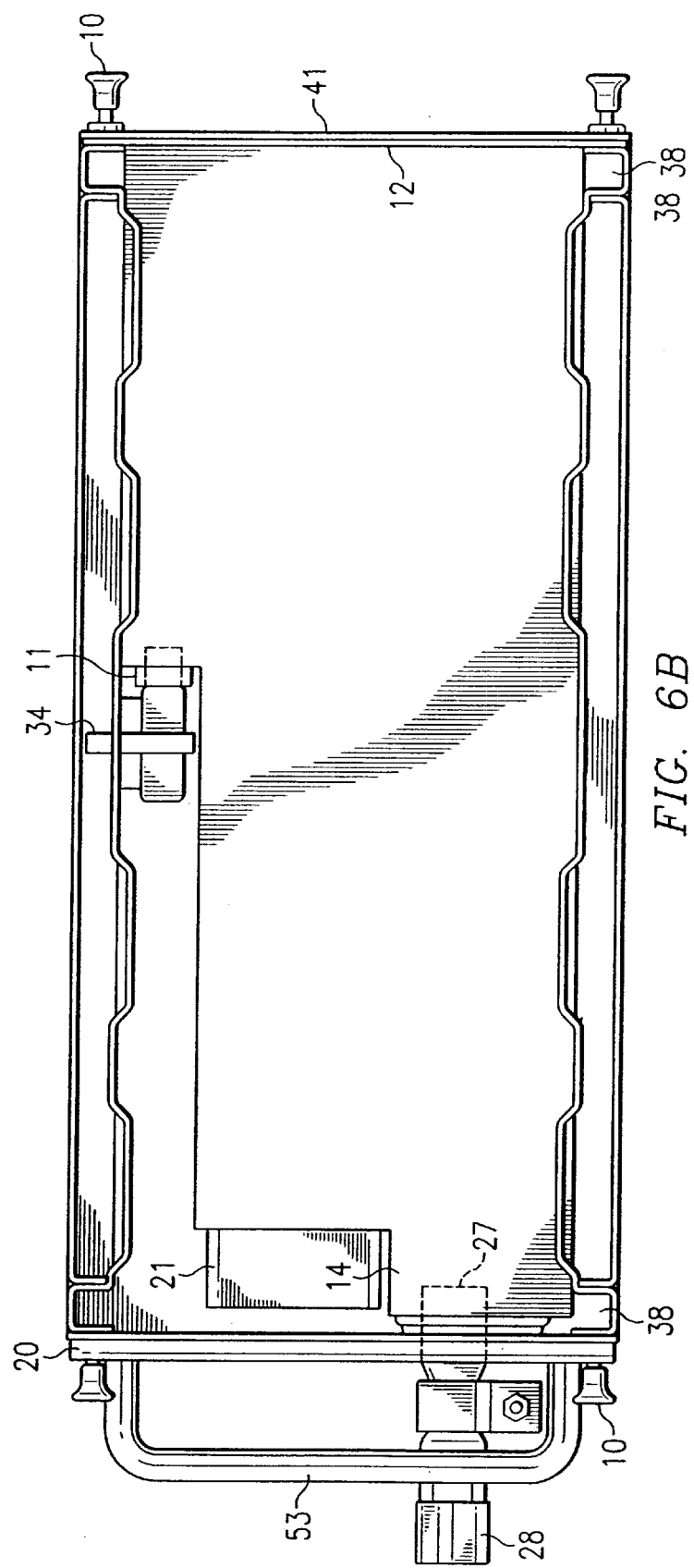

Referring to FIGS. 6A and 6B, a side view of the chassis is shown with a power supply module inserted in a module bay wherein the communicating end 14 of the module is in operational engagement with a repositionable plate 20. The power supply module in FIGS. 6A and 6B is identical to the power supply module described in example 2. One or more manually actuatable fasteners 10 are used to couple the repositionable plate 20 to the repositionable plate mounting bracket 38 on the chassis. The power supply module is coupled to the module bay through a connection between the power connector 11 and the intersection board 34.

FIG. 6A illustrates the chassis with the module inserted from the front. FIG. 6B illustrate the chassis with the module inserted from the back. In FIGS. 6A and 6BA, the module is inserted into a modular bay from the front of the chassis. The repositionable plate 20 is operational contacted with the communicating end 14 of the module and connected to the rear of the chassis 41 using a repositionable plate mounting bracket 38.

In FIGS. 6A and 6B, the module is inserted into a modular bay from the rear of the chassis. The repositionable plate 20 is operationally contacted with the communicating end 14 of the module and connected to the front of the chassis 40 using a repositionable plate mounting bracket 38.

Example 5

Figure 7A:
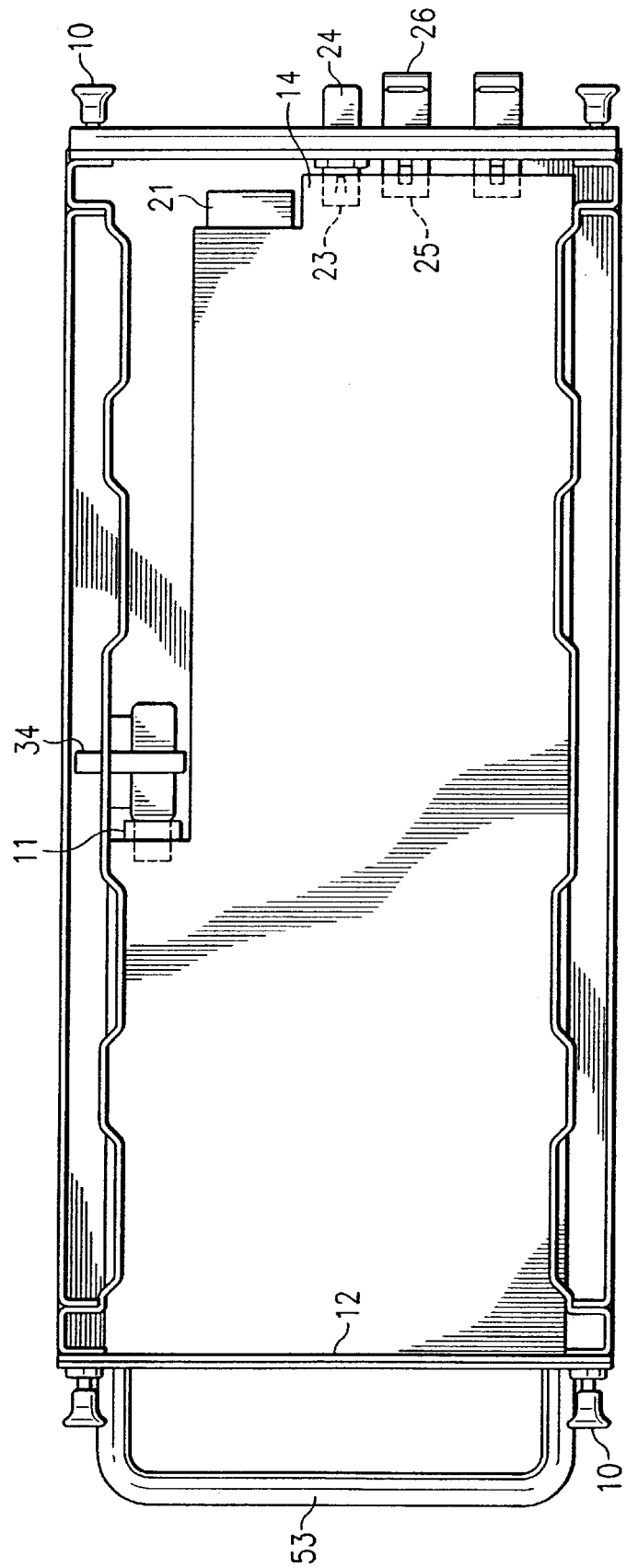

Referring to FIGS. 7A and 7B, a side view of the chassis is shown with a module inserted in a module bay wherein the communicating end 14 of the module is in operational engagement with a Repositionable plate 20. The module in FIGS. 7A and 7B is identical to the module described in example 1. One or more manually actuatable fasteners 10 are used to couple the repositionable plate 20 to the repositionable plate mounting bracket 38 on the chassis. The power supply module is coupled to the module bay through a connection between the power connector 11 and the intersection board 34.

FIG. 7A illustrate the chassis with the module inserted from the front. FIG. 7B illustrate the chassis with the module inserted from the back.

In FIG. 7A, the module is inserted into a modular bay from the front of the chassis. The repositionable plate 20 is operationally contacted with the communicating end 14 of the module and connected to the rear of the chassis 41 using a repositionable plate mounting bracket 38.

In FIG. 7B, the module is inserted into a modular bay from the front of the chassis. The repositionable plate 20 is operationally contacted with the communicating end 14 of the module and connected to the front of the chassis 40 using a repositionable plate mounting bracket 38.

Practical Applications of the Invention

A practical application of the invention that has value within the technological arts is rack mounted electrical equipment. The invention is useful in conjunction with communication networks, (e.g. LAN, MAN and/or WAN). There are virtually innumerable uses for the invention, all of which need not be detailed here.

Advantages of the Invention

A chassis representing an embodiment of the invention, can be cost effective and advantageous for at least the following reasons.

The intermediate board or virtual intermediate board allows for a greater variety of positions for placement of the modular components. This greatly increases the versatility of the modular system. This invention allows for a high density of modules to be placed in a chassis, reducing the number of chassis and thereby the cost required in an electrical system.

The ability to separate the module from the back plate allows for replacement of only the part which needs replacement. The availability of a variety of positions for placement of both the modules and the repositionable plates allows for a versatility in the chassis configuration not allowable with the prior art. The reduction in number of wires external to the chassis (i.e., removing a "rat's nest") reduces the amount of time required to trace wires or cables to find necessary connections when reconfiguring the electrical system.

The intermediate board or virtual intermediate board allows for a greater variety of positions for placement of the modular components. This greatly increases the versatility of the modular system. This invention allows for a high density of modules to be placed in a chassis, reducing the number of chassis and thereby the cost required in an electrical system.

All the embodiments of the invention disclosed and claimed herein can be made and executed without undue experimentation in light of the present disclosure. While the compositions and methods of this invention have been described in terms of preferred embodiments, it will be apparent to those of skill in the art that variations may be applied to the methods and in the steps or in the sequence of steps of the method described herein without departing from the concept, spirit and scope of the invention. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the chassis, repositionable plates and modules described herein can be physically separate, it will be manifest that the chassis, repositionable plates and modules may be integrated into the apparatus with which they are associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements.

The appended claims are not to be interpreted as including means-plus-function limitations, unless such a limitation is explicitly recited in a given claim using the phrase "means for" or "step for." Expedient embodiments of the invention are differentiated by the appended subclaims.

What is claimed is:

1. An apparatus comprising:
    a chassis including
        a first plate mounting bracket and
        a second plate mounting bracket, said chassis defining a first module bay and a second module bay;
    a repositionable plate removably connected to said first plate mounting bracket and removably connectable to said second plate mounting bracket; and
    a module inserted and positioned at least in part within said first module bay, coupled to said repositionable plate, and separatable from said repositionable plate while said repositionable plate remains removably connected to said first plate mounting bracket allowing replacement of only a part that needs replacement,
    wherein said repositionable plate includes an electrical feedthrough.

2. An apparatus comprising:
    a chassis including
        a first plate mounting bracket and
        a second plate mounting bracket, said chassis defining a first module bay and a second module bay;
    a repositionable plate removably connected to said first plate mounting bracket and removably connectable to said second plate mounting bracket; and
    a module inserted and positioned at least in part within said first module bay, coupled to said repositionable plate, and separatable from said repositionable plate while said repositionable plate remains removably connected to said first plate mounting bracket allowing replacement of only a part that needs replacement,
    wherein said chassis includes a midplane board.

3. A method, comprising:
    providing a chassis with
        a first plate mounting bracket and
        a second plate mounting bracket, said chassis defining a first module bay and a second module bay;
    connecting a repositionable plate to said first plate mounting bracket, said repositionable plate removable from said first plate mounting bracket and removably connectable to said second plate mounting bracket;
    inserting and positioning a module at least in part within said first module bay;
    coupling the module to said repositionable plate; and
    positioning a module within said first module bay and electrically coupling said module to said repositionable plate,
    wherein the module is separatable from said repositionable plate while the repositionable plate remains connected to the first plate mounting bracket allowing replacement of only a part that needs replacement.

4. A method, comprising:
    providing a chassis with
        a first plate mounting bracket and
        a second plate mounting bracket, said chassis defining a first module bay and a second module bay;
    connecting a repositionable plate to said first plate mounting bracket, said repositionable plate removable from said first plate mounting bracket and removably connectable to said second plate mounting bracket;
    inserting and positioning a module at least in part within said first module bay;
    coupling the module to said repositionable plate; and
    wherein the module is separatable from said repositionable plate while the repositionable plate remains connected to the first plate mounting bracket allowing replacement of only a part that needs replacement,
    forcing air through ventilation slots located in said repositionable plate.

5. A method, comprising:
    providing a chassis with
        a first plate mounting bracket and
        a second plate mounting bracket, said chassis defining a first module bay and a second module bay;
    connecting a repositionable plate to said first plate mounting bracket, said repositionable plate removable from said first plate mounting bracket and removably connectable to said second plate mounting bracket;

inserting and positioning a module at least in part within said first module bay;

coupling the module to said repositionable plate; and wherein the module is separatable from said repositionable plate while the repositionable plate remains connected to the first plate mounting bracket allowing replacement of only a part that needs replacement, conducting power through an electric feedthrough located in said repositionable plate.

6. A method, comprising:

providing a chassis with
   a first plate mounting bracket and
   a second plate mounting bracket, said chassis defining a first module bay and a second module bay;

connecting a repositionable plate to said first plate mounting bracket, said repositionable plate removable from said first plate mounting bracket and removably connectable to said second plate mounting bracket;

inserting and positioning a module at least in part within said first module bay;

coupling the module to said repositionable plate; and communicating data through an electric feedthrough located in said repositionable plate, wherein the module is separatable from said repositionable plate while the repositionable plate remains connected to the first plate mounting bracket allowing replacement of only a part that needs replacement.

7. A kit, comprising;

a chassis including
   a first plate mounting bracket and
   a second plate mounting bracket, said chassis defining a first module bay and a second module bay;

a repositionable plate removably connected to said first plate mounting bracket and removably connectable to said second plate mounting bracket; and a module inserted and positioned at least in part within said first module bay, coupled to said repositionable plate, and separatable from said repositionable plate while said repositionable plate remains removably coupled to said first plate mounting bracket allowing replacement of only a part that needs replacement, wherein said chassis includes a midplane board.

* * * * *

UNITED STATES PATENT AND TRADEMARK OFFICE
CERTIFICATE OF CORRECTION

PATENT NO.   : 6,523,916 B2
DATED        : February 25, 2003
INVENTOR(S)  : Guy Sucharczuk et al.

It is certified that error appears in the above-identified patent and that said Letters Patent is hereby corrected as shown below:

Column 7,
Lines 36-46, delete the language beginning with "and are used for" and ending with "included."

Signed and Sealed this

Nineteenth Day of August, 2003

JAMES E. ROGAN
*Director of the United States Patent and Trademark Office*